(12) United States Patent
Lee

(10) Patent No.: US 8,263,473 B2
(45) Date of Patent: Sep. 11, 2012

(54) METHOD OF FORMING SEMICONDUCTOR DEVICES

(75) Inventor: Sang Soo Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/174,880

(22) Filed: Jul. 1, 2011

(65) Prior Publication Data
US 2012/0007162 A1 Jan. 12, 2012

(30) Foreign Application Priority Data
Jul. 7, 2010 (KR) .................. 10-2010-0065354

(51) Int. Cl.
*H01L 21/76* (2006.01)

(52) U.S. Cl. ........ 438/424; 438/433; 438/448; 438/778; 257/E21.546

(58) Field of Classification Search .................. 438/448; 257/E21.546
See application file for complete search history.

(56) References Cited

U.S. PATENT DOCUMENTS

| | | | |
|---|---|---|---|
| 6,352,866 B1 * | 3/2002 | Basceri | 438/3 |
| 2004/0266135 A1 * | 12/2004 | Dong et al. | 438/435 |
| 2004/0266215 A1 * | 12/2004 | Park | 438/778 |
| 2005/0142765 A1 * | 6/2005 | Joo | 438/264 |
| 2006/0043456 A1 * | 3/2006 | Derderian et al. | 257/314 |
| 2006/0281276 A1 * | 12/2006 | Park | 438/373 |
| 2007/0007582 A1 * | 1/2007 | Hatakeyama | 257/316 |
| 2008/0277665 A1 * | 11/2008 | Dong et al. | 257/66 |
| 2009/0117728 A1 * | 5/2009 | Kim | 438/594 |
| 2009/0140320 A1 * | 6/2009 | Lee et al. | 257/321 |

FOREIGN PATENT DOCUMENTS

| | | |
|---|---|---|
| JP | 11111871 A | 4/1999 |
| JP | 2002-064157 | 2/2002 |
| KR | 1020050118686 A | 12/2005 |
| KR | 1020090056454 A | 6/2009 |

* cited by examiner

*Primary Examiner* — Angel Roman
(74) *Attorney, Agent, or Firm* — William Park & Associates Ltd.

(57) ABSTRACT

A semiconductor device includes an insulating layer and an undoped polysilicon layer that are stacked over a semiconductor substrate. The semiconductor substrate is exposed by removing the portions of the undoped polysilicon layer and the insulating layer. The trenches are formed by etching the exposed semiconductor substrate. Isolation layers are formed in the trenches, and a doped polysilicon layer is formed by implanting impurities into the undoped polysilicon layer.

12 Claims, 4 Drawing Sheets

METHOD OF FORMING SEMICONDUCTOR DEVICES

CROSS-REFERENCE TO RELATED APPLICATION

Priority to Korean patent application number 10-2010-0065354 filed on Jul. 7, 2010, the entire disclosure of which is incorporated by reference herein, is claimed.

BACKGROUND

Exemplary embodiments relate generally to semiconductor devices and, more particularly to implantation of impurities in one or more conductive layers in fabricating a semiconductor device.

A polysilicon layer is often used for gate patterns in semiconductor devices. For example, a polysilicon layer may be used to form the floating gates in a NAND flash memory device having the structure advantageous for higher integration.

FIGS. 1A and 1B show the cross-sectional views of the conventional semiconductor devices including gate electrodes formed of a polysilicon layer, and more particularly related to forming floating gates in a NAND flash memory device.

Referring to FIG. 1A, an insulating layer 3, a first polysilicon layer 5, and a second polysilicon layer 7 are formed over a semiconductor substrate 1.

The insulating layer 3 is used to insulate the semiconductor substrate 1 from the gate electrodes, such as the floating gates to be formed over the semiconductor substrate 1. In particular, the insulating layer 3 is used as a tunnel insulating layer where the electrons from the floating gates above would pass through for storing or discharging the electrons of a NAND flash memory device.

The first polysilicon layer 5 and the second polysilicon layer 7 are conductive layers used as the gate electrodes such as the floating gates. There are more nano grain size crystals in the first polysilicon layer 5 adjoining the insulating layer 3 than in the second polysilicon layer 7. The first polysilicon layer 5 is formed of an undoped polysilicon layer without impurities. The second polysilicon layer 7 is formed of doped polysilicon having the impurities 9 in order to allow the gate electrodes (to be formed from the polysilicon layers 5 and 7) to have a low resistance value.

Referring to FIG. 1B, a hard mask pattern (not shown) is formed to cover certain predetermined portions of the second polysilicon layer 7 that are not to be etched, that is in subsequent processes. Using the hard mask pattern (not shown) as an etch mask, the first and second polysilicon layers 5 and 7 are etched, thereby forming polysilicon patterns P for floating gates. Further, again using the hard mask pattern as an etch mask, the insulating layer 3 and the predetermined portions of the semiconductor substrate 1 corresponding to the isolation regions may be etched by to form the trenches 11 in the isolation regions of the semiconductor substrate 1. Then, the trenches are filled with the isolation insulating layers 13 as shown in FIG. 1B such that active regions of the semiconductor substrate 1 are defined by the isolation insulating layers 13.

For high integration, the size of the polysilicon pattern P needs to be minimized. However, when the area of a polysilicon pattern P is sharply reduced, the poly depletion phenomenon will likely occur because of insufficient amount of impurities 9 being present in the polysilicon patterns P. Worsening poly depletion phenomenon will generate an error in the semiconductor device operations.

When the concentration of the impurities 9 in the second polysilicon layer 7 is increased as an attempt to minimize the poly depletion phenomenon, it may cause the impurities 9 in the second polysilicon layer 7 to be diffused by the heat generated in a subsequent process and cause the impurities 9 to accumulate near the insulating layer 3 that is used as the tunnel insulating layer. If the impurities 9 are accumulated near the insulating layer 3 used as the tunnel insulating layer, it will degrade the performance characteristics of the insulating layer 3 and cause the semiconductor device to malfunction.

BRIEF SUMMARY

Exemplary embodiments relate to a method of forming semiconductor devices, which is capable of solving a problem that impurities are accumulated on an insulating layer under a polysilicon layer even if a concentration of the impurities included in the polysilicon layer is increased.

A method of forming semiconductor devices according to an aspect of the present disclosure includes stacking an insulating layer and an undoped polysilicon layer over a semiconductor substrate, exposing the semiconductor substrate by removing portions of the undoped polysilicon layer and the insulating layer, forming trenches by etching the exposed semiconductor substrate, forming isolation layers in the respective trenches, and forming a doped polysilicon layer by implanting impurities into the undoped polysilicon layer.

The isolation layers are formed by filling the trenches with an insulating substance for the isolation layers and hardening the insulating substance using an annealing process. Polysilazane (PSZ) may be used as the insulating substance. Temperature applied to the semiconductor substrate after the annealing process preferably is lower than temperature in the annealing process.

The undoped polysilicon layer is formed by forming a first undoped polysilicon layer, having a first grain, on the insulating layer and forming a second undoped polysilicon layer, having a second grain greater than the first grain, on the first undoped polysilicon layer. The impurities are implanted into the second undoped polysilicon layer, thereby forming the doped polysilicon layer.

The impurities are 3-valence or 5-valence impurities. The impurities are implanted using an ion beam implantation method or a plasma ion doping method.

The doped polysilicon layer may be formed by forming a sacrificial layer for blocking the isolation layer, but opening the remaining undoped polysilicon layer, implanting the impurities by using the sacrificial layer as an ion implantation mask, and removing the sacrificial layer.

The impurities are limited to and implanted into an upper portion of the undoped polysilicon layer.

The undoped polysilicon layer and the doped polysilicon layer may be used as the floating gates of a NAND flash memory device.

A concentration of the impurities within the doped polysilicon layer preferably is reduced toward the insulating layer.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1A:
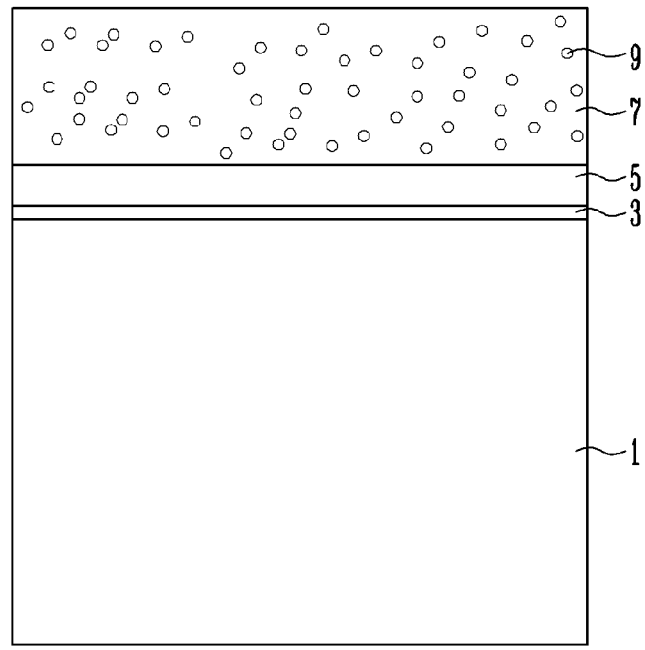
FIGS. 1A and 1B are cross-sectional views illustrating a known method of forming semiconductor devices including gate electrodes formed of a polysilicon layer.
Figure 1B:
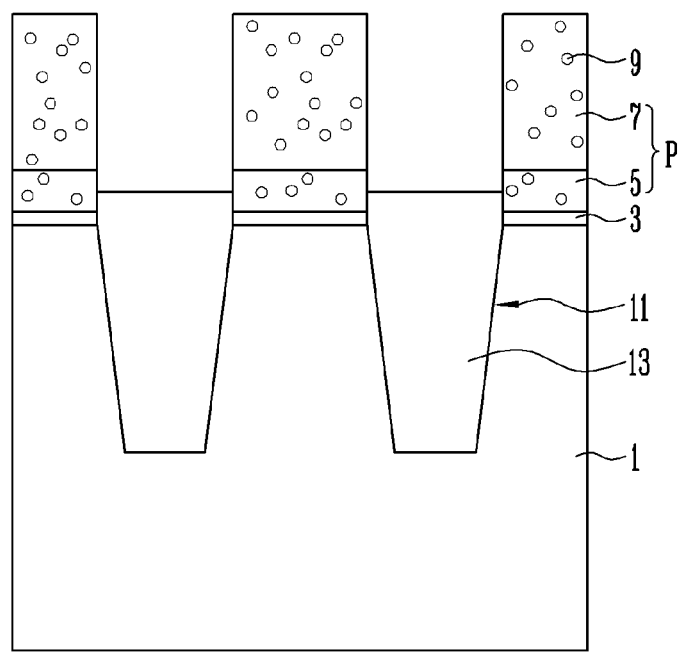
Figure 2A:
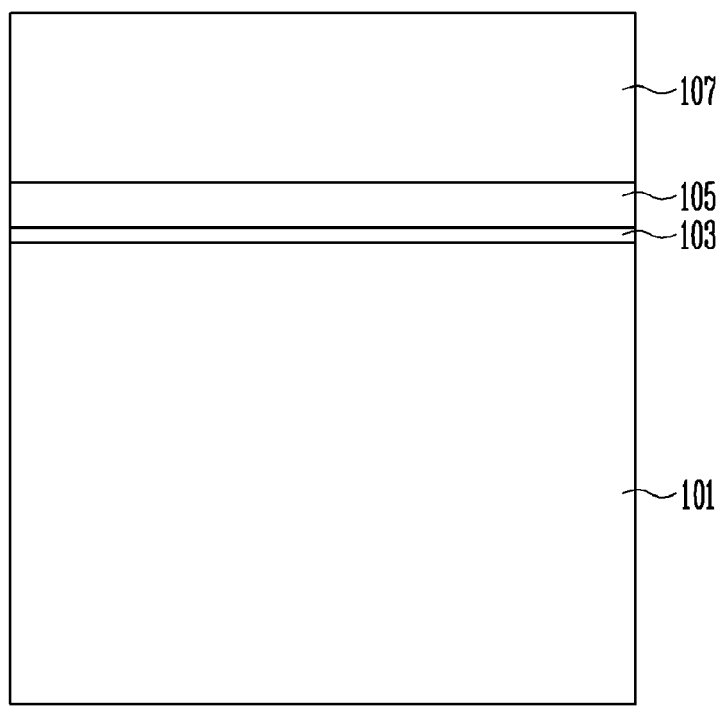
FIGS. 2A to 2C are cross-sectional views illustrating a method of forming semiconductor devices according to an embodiment of this disclosure.
Figure 2B:
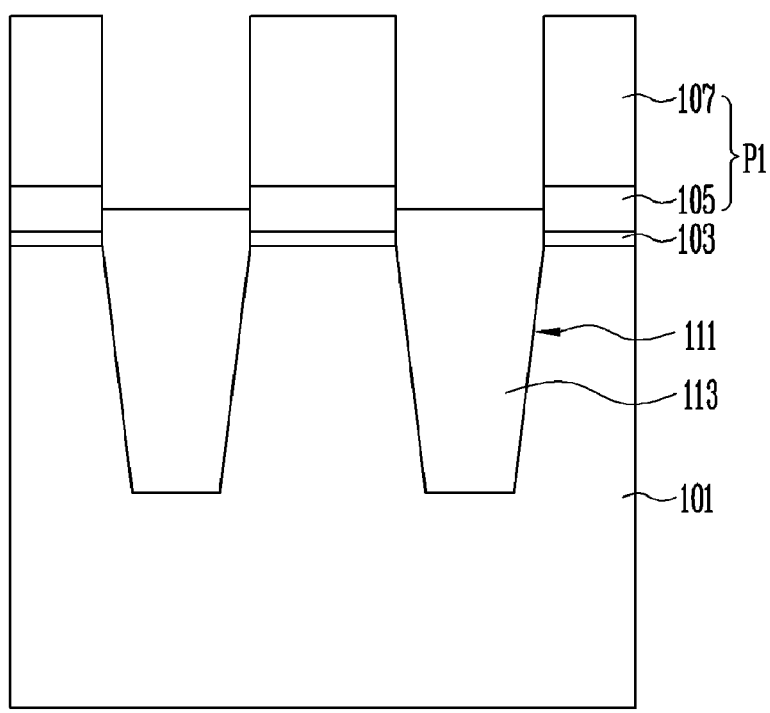
Figure 2C:
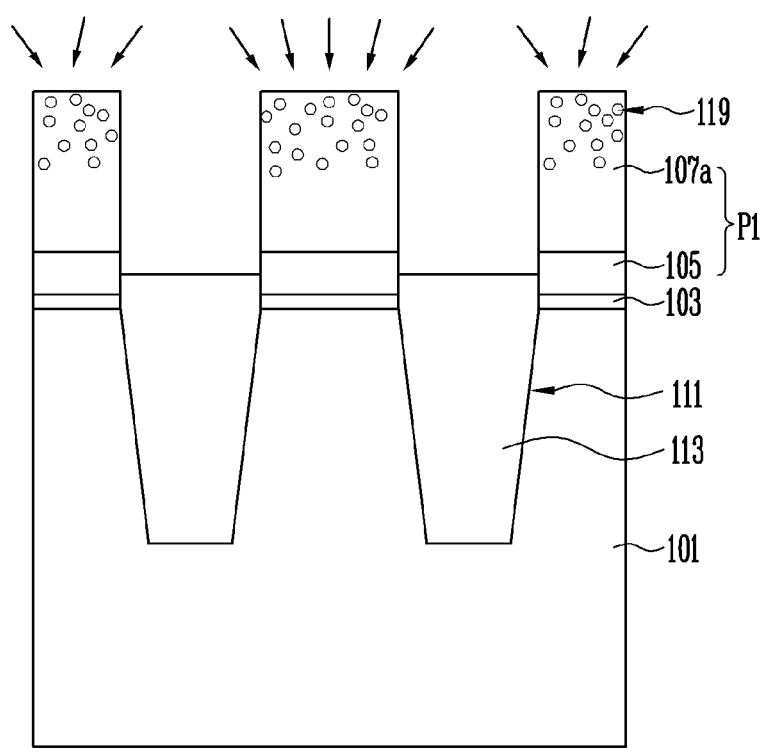

FIGS. 2A to 2C are cross-sectional views showing a part of a semiconductor device made in accordance with an embodiment of this disclosure. In particular, FIGS. 2A to 2C may relate to, inter alia, a part of forming the floating gates in a NAND flash memory device. Although an embodiment of the present invention is described with respect a NAND flash memory, the concepts and inventive scope of the present disclosure is not limited only to NAND memory flash devices but may be applicable to all other types of semiconductor devices, including NOR flash memory devices.

Referring to FIG. 2A, an insulating layer 103 and undoped polysilicon layers 105 and 107 are stacked over a semiconductor substrate 101. The semiconductor substrate 101 includes isolation regions.

The insulating layer 103 insulates the semiconductor substrate 101 from the gate electrodes such as the floating gates that are to be formed over the semiconductor substrate 101. The insulating layer 103 is used as a tunnel insulating layer through which electrons pass under the floating gates for storing or discharging the electrons of the NAND flash memory device. The insulating layer 103 may be formed by depositing an oxide layer or by oxidizing the semiconductor substrate 101. The insulating layer 103 may be formed of a silicon oxide ($SiO_2$) layer.

The undoped polysilicon layers 105 and 107 are conductive layers to be used as the gate electrodes such as the floating gates. The undoped polysilicon layers 105 and 107 may be formed in a single layer instead or of multiple layers, as shown in FIG. 2A, such as the first undoped polysilicon layer 105 and the second undoped polysilicon layer 107. The first undoped polysilicon layer 105 adjoining the insulating layer 103 has a first grain. The second undoped polysilicon layer 107 over the first undoped polysilicon layer 105 has a second grain greater than the first grain.

When the first grain has a nano scale smaller than the second grain as described above, the boundary of the first grain of the first undoped polysilicon layer 105 per area can become uniform. After patterning the first undoped polysilicon layer 105, each cell characteristic of the semiconductor device can become uniform because the grain boundary can become uniform in each cell.

Referring to FIG. 2B, the parts of the undoped polysilicon layers 105, 107 formed over the isolation regions of the semiconductor substrate 101 are removed to expose the portions of the insulating layer 103 corresponding to the isolation regions of the semiconductor substrate 101. The polysilicon patterns P1 is then formed by the remaining portions of the etched undoped polysilicon layers 105, 107. The polysilicon patterns P1 are to be used as the gate electrodes such as the floating gates are formed over the active regions of the semiconductor substrate 101 that are separated by the isolation regions.

The exposed portions of the insulating layer 103 are etched away to expose the isolation regions of the semiconductor substrate 101. The exposed isolation regions of the semiconductor substrate 101 are then etched to form the trenches 111 in the semiconductor substrate 101. The second undoped polysilicon layer 107, the first undoped polysilicon layer 105, the insulating layer 103, and the isolation regions of the semiconductor substrate 101 are etched by using a hard mask pattern (not shown) as an etch mask after the hard mask pattern is formed on the second undoped polysilicon layer 107.

After forming the trenches 111, the trenches 111 are filled with an insulating layer as the isolation layers, for example, until the height of the insulating layer is higher than the top surface of the second undoped polysilicon layer 107 or the top surface of the hard mask pattern (not shown) The insulating layer for the isolation layers may be formed by filling the trenches 111 with a flowable insulating substance so that the trenches 111 are easily filled even with the reduced aspect ratio of the trenches 111 and then by hardening the insulating substance in an annealing process. For example, the insulating layer for the isolation layers may be formed by filling the trenches 111 with flowable polysilazane (PSZ) and then hardening the insulating layer in the trenches 111 by an annealing process performed at a temperature of about 900° C. for about 1 hour.

A polishing process such as a Chemical Mechanical Polishing (CMP) process is performed to remove excess portions of the insulating layer that are formed outside the isolation regions of the semiconductor substrate 101. For example, the polishing process may be performed on the insulating layer for the isolation layers until the top surface of the hard mask pattern (not shown) is exposed such that excess portions of the insulating layer outside the isolation regions of the semiconductor substrate 101 are removed.

Next, isolation layers 113 are formed by an etch process so that the height of the insulating layer for the isolation layers 113 in the trenches 111 is lower than the top surface of the second undoped polysilicon layer 107, but higher than a top surface of the insulating layer 103.

Because the height of the isolation layers 113 is lower than the top surface of the second undoped polysilicon layer 107 but higher than the top surface of the insulating layer 103, it helps to improve the coupling ratio by increasing the opposite areas of the floating gates and the control gates of the NAND flash memory device, which are to be formed in the subsequent processes. After forming the isolation layers 113, the remaining hard mask pattern (not shown) may be removed.

Temperature in the annealing process for hardening the insulating layer for the isolation layers 113 is higher than the temperature applied to the semiconductor substrate 101 in the subsequent processes. Accordingly, the annealing process for hardening the insulating layer for the isolation layers 113 influences the diffusion of impurities. In an embodiment of the present disclosure, in the annealing process for hardening the insulating layer for the isolation layers, the impurities have not yet been implanted into the polysilicon patterns P1. Thus, the impurities in the polysilicon patterns P1 are prevented from being accumulated on the insulating layer 103.

Referring to FIG. 2C, after the isolation layers 113 are formed, the impurities 119 are implanted to the exposed polysilicon patterns P1 comprising the first and second undoped polysilicon layers 105, 107 in order for the gate electrodes to have a low resistance value. However, implanting of the impurities 119 may be limited to the second undoped polysilicon layer 107 in order to minimize the diffusion of the impurities toward the insulating layer 103. The second undoped polysilicon layer 107 when implanted with impurities becomes a doped polysilicon layer 107a including the impurities 119 as shown in FIG. 2C. Each polysilicon pattern P1 then has a stack structure comprising the first undoped polysilicon layer 105 and the doped polysilicon layer 107a. Furthermore, more impurities are implanted nearer to the upper portion of the second undoped polysilicon layer 107, and therefore the impurity concentration of the doped polysilicon layer 107a reduces gradually from the upper to lower portion (that is, towards the insulating layer 203) of the doped polysilicon layer 107a with respect to the diffusion of the impurities. This minimizes the diffusion of impurities toward the insulating layer 103 formed under the doped polysilicon layer 107a.

The impurities 119 may include 5-valence impurities such as phosphorus (P) or 3-valence impurities such as boron (B), among others.

The impurities 119 may be implanted into each polysilicon pattern P1 by various implantation techniques such as an ion beam implantation method or a plasma ion doping method. In an ion beam implantation method, ionized impurities are accelerated with specific energy for implantation in a target. In a plasma ion doping method, ionized atoms in a plasma state are used for doping a target.

After forming the polysilicon patterns P1 having the impurities 119 implanted therein as described above, a dielectric layer may be formed by stacking an oxide layer, a nitride layer, and an oxide layer over the isolation layers 113 and the polysilicon patterns P1 including the impurities 119. A conductive layer for control gates may be formed over the dielectric layer. The stack type gate patterns of the NAND flash memory device are then formed by patterning the conductive layer for the control gates, the dielectric layer, and the polysilicon patterns P1. Impurities are implanted into the semiconductor substrate 101 on both sides of each of the gate patterns by using the stack type gate patterns as a mask, thereby forming the junctions of the NAND flash memory device. An annealing process for diffusing and activating the impurities implanted into the junctions may be further performed.

The annealing process for diffusing and activating the impurities implanted into the junctions may be performed at a temperature of about 840° C., which is lower than the temperature used in the annealing process for hardening the insulating layer for the isolation layers, for about 90 minutes. In this case, the annealing process for diffusing and activating the impurities implanted into the junctions has less influence on the impurities 119 of the polysilicon patterns P1 than the annealing process for hardening the insulating layer for the isolation layers. After the junctions are formed, a subsequent process for forming an interlayer dielectric layer is performed.

Furthermore, the impurities implanted into the junctions can be diffused or activated by a subsequent annealing process, performed after the impurities are implanted, even if an additional annealing process is not performed. The impurities implanted into the polysilicon patterns P1 can be diffused or activated within the polysilicon patterns P1 through heat used in a subsequent process or an additional annealing process.

As described above, in an embodiment of this disclosure, an insulating substance used as the isolation insulating layers is hardened at a high temperature, and the impurities are implanted into the polysilicon patterns. Accordingly, a phenomenon in which the impurities within the polysilicon patterns are diffused into the insulating layer under the polysilicon patterns can be improved. Even if a concentration of the impurities within the polysilicon patterns is increased, the impurities diffused from the polysilicon patterns to the underlying insulating layer can be prevented from being accumulated on the insulating layer under the polysilicon patterns.

Figure 3A:
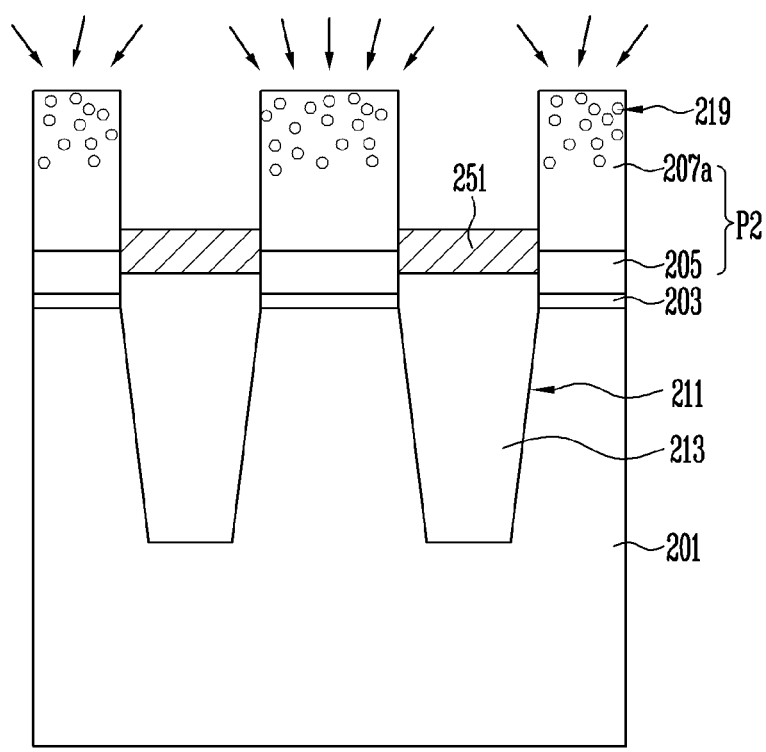
FIGS. 3A and 3B are cross-sectional views illustrating a method of forming semiconductor devices according to another embodiment of this disclosure.
Figure 3B:
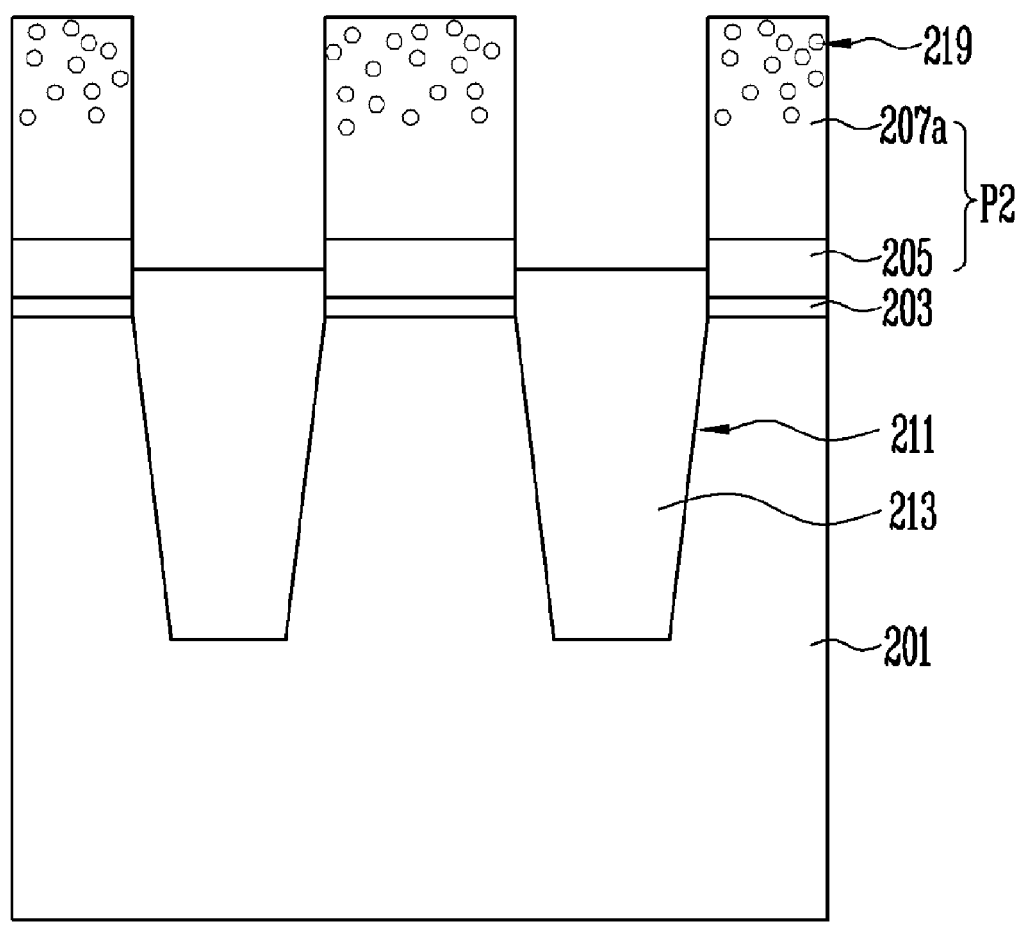

FIGS. 3A and 3B are cross-sectional views illustrating a method of forming semiconductor devices according to another embodiment of this disclosure. In particular, FIGS. 3A and 3B are cross-sectional views illustrating a part of a method of forming the floating gates of a NAND flash memory device.

Referring to FIG. 3A, an insulating layer 203, a first undoped polysilicon layer 205, and a second undoped polysilicon layer (this layer then becomes a doped polysilicon layer 207a, which is shown in FIG. 3A) are stacked over a semiconductor substrate 201 having the isolation regions. Polysilicon patterns P2 are formed by etching the second undoped polysilicon layer and the first undoped polysilicon layer 205. Furthermore, the trenches 211 are formed by etching the insulating layer 203 and the semiconductor substrate 201. The trenches 211 are filled with an insulating substance. Isolation layers 213 are formed by controlling the height of the insulating substance while hardening the insulating substance. Next, impurities 219 are implanted into only the second undoped polysilicon layer, thereby forming the polysilicon patterns P2, each having a stack structure of the first undoped polysilicon layer 205 and the doped polysilicon layer 207a.

However, associated with the implantation of the impurities 219, a sacrificial layer 251 as shown in FIG. 3A for blocking the isolation layers 213 but opening the polysilicon patterns P2 may be formed additionally. The impurities 219 are then implanted by using the sacrificial layer 251 as an ion implantation mask, and thus the top surface of the sacrificial layer 251 is higher than the top surface of the first undoped polysilicon layer 205. This prevents the impurities 219 from being implanted into the isolation layers 213, the first undoped polysilicon layer 205, and the insulating layer 203.

Furthermore, more impurities are implanted nearer to the upper portion of the second undoped polysilicon layer, and therefore the impurity concentration of the doped polysilicon layer 207a reduces from the upper to lower portion (that is, towards the insulating layer 203) of the doped polysilicon layer 207a with respect to the diffusion of the impurities. This minimizes the diffusion of the impurities toward the insulating layer 203 formed under the doped polysilicon layer 207a.

Referring to FIG. 3B, the sacrificial layer 251 is removed after the impurities 219 are implanted. Next, the known processes of forming a dielectric layer, a conductive layer for control gates, and a dielectric layer and patterning the polysilicon patterns P2, which have been described in connection with the first embodiment, are performed.

As described above, as in various embodiments of the present disclosure, an insulating substance used as the isolation insulating layers is hardened at high temperature, and the impurities are implanted into the polysilicon patterns. Accordingly, a phenomenon in which the impurities within the polysilicon patterns are diffused into the insulating layer under the polysilicon patterns can be improved. Even if a concentration of the impurities within the polysilicon patterns is increased, the impurities diffused from the polysilicon patterns to the underlying insulating layer can be prevented from being accumulated on the insulating layer under the polysilicon patterns.

As described above, according to an embodiment of the present disclosure, after the isolation layers requiring an annealing process of a high temperature are formed, the impurities are implanted into the polysilicon patterns. Accordingly, the impurities within the polysilicon patterns can be fundamentally prevented from diffusing into the insulating layer under the polysilicon patterns by means of the annealing process for forming the isolation layers. Even if a concentration of the impurities within the polysilicon patterns is increased, the impurities diffused from the polysilicon patterns to the underlying insulating layer can be prevented from being accumulated on the insulating layer under the polysilicon patterns Furthermore, according to an embodiment of the present disclosure, since the impurities are prevented from being accumulated on the insulating layer under the polysilicon patterns, the degradation of a characteristic of the insulating layer due to the impurities can be reduced, and reliability of a semiconductor device can be improved.

Furthermore, according an embodiment of to the present disclosure, the manufacturing cost can be reduced without the investment of new equipment because the impurities can be prevented from being accumulated on the insulating layer under the polysilicon patterns.

What is claimed is:

1. A method of forming semiconductor devices, comprising:
    forming an insulating layer over a semiconductor substrate;
    forming an undoped polysilicon layer over the insulating layer;
    removing a portion from each of the undoped polysilicon layer, the insulating layer, and the semiconductor substrate so as to form a trench;
    filling the trench with an insulating substance for an isolation layer;
    performing a first annealing process so as to harden the insulating substance;
    implanting impurities into the undoped polysilicon layer so as to convert a portion of the undoped polysilicon layer into a doped polysilicon layer; and
    performing a second annealing process on an entire structure including the doped polysilicon layer,
    wherein temperature applied in the second annealing process is lower than temperature applied in the first annealing process.

2. The method of claim 1, wherein the insulating substance comprises polysilazane (PSZ).

3. The method of claim 1, wherein forming undoped polysilicon layer comprises:
    forming a first undoped polysilicon layer having a first grain on the insulating layer; and
    forming a second undoped polysilicon layer having a second grain greater in size than the first grain on the first undoped polysilicon layer.

4. The method of claim 3, wherein the impurities are implanted into the second undoped polysilicon layer so as to convert the second undoped polysilicon layer into the doped polysilicon layer.

5. The method of claim 1, wherein the impurities comprise 3-valence or 5-valence impurities.

6. The method of claim 1, wherein the impurities are implanted using ion beam implantation or plasma ion doping.

7. The method of claim 1, further comprising:
    forming a sacrificial layer over the isolation layer in the trench while exposing the undoped polysilicon layer for use as an ion implantation mask; and
    removing the sacrificial layer after implanting impurities into the undoped polysilicon layer.

8. The method of claim 1, wherein, in the step of implanting impurities into the undoped polysilicon layer, more impurities are implanted to an upper portion of the undoped polysilicon layer that is farther away from the insulating layer.

9. The method of claim 1, wherein the undoped polysilicon layer and the doped polysilicon layer are used as floating gates of a NAND flash memory device.

10. The method of claim 1, wherein the impurities are activated and diffused within the doped polysilicon layer during the second annealing process.

11. The method of claim 1, further comprising:
    before the step of performing the second annealing process, implanting impurities into a junction region of the semiconductor substrate.

12. The method of claim 11, wherein the impurities implanted into the junction region are activated and diffused within the junction region during the second annealing process.

* * * * *